United States Patent
Borthakur et al.

(10) Patent No.: US 10,120,182 B2
(45) Date of Patent: Nov. 6, 2018

(54) IMAGING SYSTEMS WITH FLUIDIC COLOR FILTER ELEMENTS

(71) Applicant: SEMICONDUCTOR COMPONENTS INDUSTRIES, LLC, Phoenix, AZ (US)

(72) Inventors: Swarnal Borthakur, Boise, ID (US); Ulrich Boettiger, Garden City, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 40 days.

(21) Appl. No.: 15/283,707

(22) Filed: Oct. 3, 2016

(65) Prior Publication Data

US 2018/0095264 A1    Apr. 5, 2018

(51) Int. Cl.
| | |
|---|---|
| G02B 26/00 | (2006.01) |
| H01L 27/146 | (2006.01) |
| H04N 9/04 | (2006.01) |
| H04N 5/33 | (2006.01) |
| G02B 5/20 | (2006.01) |

(52) U.S. Cl.
CPC ........... *G02B 26/004* (2013.01); *G02B 5/201* (2013.01); *G02B 26/007* (2013.01); *H01L 27/14621* (2013.01); *H01L 27/14645* (2013.01); *H04N 5/33* (2013.01); *H04N 9/045* (2013.01)

(58) Field of Classification Search
CPC .............. H04N 9/04; H04N 9/045; H04N 2209/00–2209/049; H01L 27/14621; G06T 7/50; G02B 5/208; G02B 5/201; G02B 5/008
See application file for complete search history.

(56) References Cited

U.S. PATENT DOCUMENTS

| | | | |
|---|---|---|---|
| 7,608,811 B2 * | 10/2009 | Ma .................... | H01L 27/14625 250/226 |
| 8,373,917 B2 | 2/2013 | Chen et al. | |
| 8,409,417 B2 | 4/2013 | Wu | |
| 8,810,883 B2 * | 8/2014 | Lee ........................ | G02B 5/201 345/48 |
| 8,830,558 B2 | 9/2014 | Kuo et al. | |
| 2003/0118921 A1 | 6/2003 | Chen et al. | |
| 2004/0231987 A1 * | 11/2004 | Sterling .............. | B01L 3/50273 204/450 |
| 2005/0273995 A1 | 12/2005 | Kanagasabapathi et al. | |

(Continued)

*Primary Examiner* — Lin Ye
*Assistant Examiner* — Chriss S Yoder, III
(74) *Attorney, Agent, or Firm* — Treyz Law Group, P.C.; Joseph F. Guihan

(57) ABSTRACT

Imaging systems may include fluidic color filter elements to increase the flexibility of the system. An imaging system may include a number of fluid reservoirs with different color filter element fluids. The imaging sensor may include a number of separated color filter chambers. Fluids from the fluid reservoirs may be directed to specific color filter chambers as desired, with the option to change the color filter fluid in a chamber to a different color filer fluid at any time. To move the fluids to and from the fluid reservoirs to the color filter chambers, electrowetting may be used. The color filter chambers may be interposed between a ground electrode and a number of patterned electrodes. Voltages may be applied to the patterned electrodes to move the fluid to desired positions within the chambers.

16 Claims, 7 Drawing Sheets

(56) References Cited

U.S. PATENT DOCUMENTS

| | | | |
|---|---|---|---|
| 2009/0021823 A1* | 1/2009 | Heim | G02B 3/14 |
| | | | 359/290 |
| 2009/0086064 A1* | 4/2009 | Mackey | G02B 5/201 |
| | | | 348/273 |
| 2013/0134039 A1 | 5/2013 | Bjornson et al. | |
| 2014/0274739 A1 | 9/2014 | Rinker et al. | |
| 2015/0027555 A1 | 1/2015 | Chen et al. | |
| 2015/0221691 A1* | 8/2015 | Watanabe | H04N 5/332 |
| | | | 348/164 |

\* cited by examiner

IMAGING SYSTEMS WITH FLUIDIC COLOR FILTER ELEMENTS

BACKGROUND

This relates generally to imaging devices, and more particularly, to imaging devices having color filter elements.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Conventional imaging pixels are covered by solid color filter elements. The color filter elements filter incident light to allow only light of a desired wavelength to reach the underlying pixel. However, the solid color filter elements of conventional imaging pixels are inflexible. After the sensor is made, the solid color filter elements cannot be easily modified to enable different desired color filter element characteristics.

It would therefore be desirable to be able to provide improved arrangements for color filter elements in image sensors.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
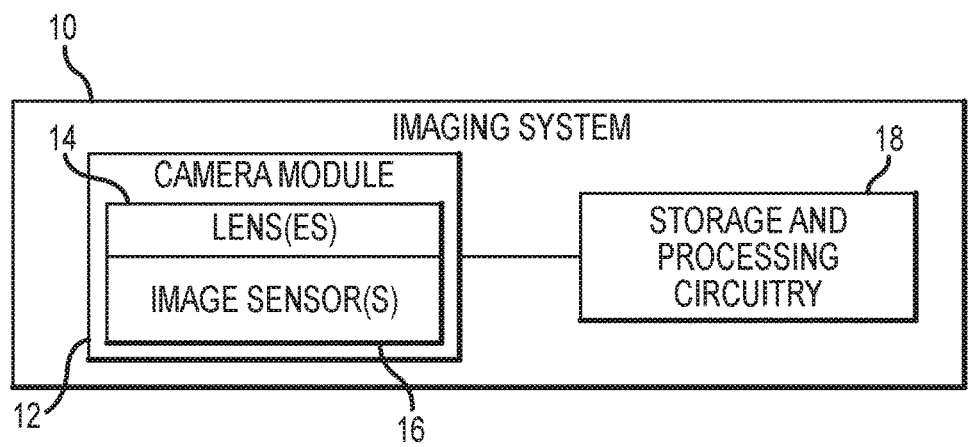
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18. Image sensor 16 and processing circuitry 18 may be implemented using a stacked-chip arrangement if desired.

Figure 2:
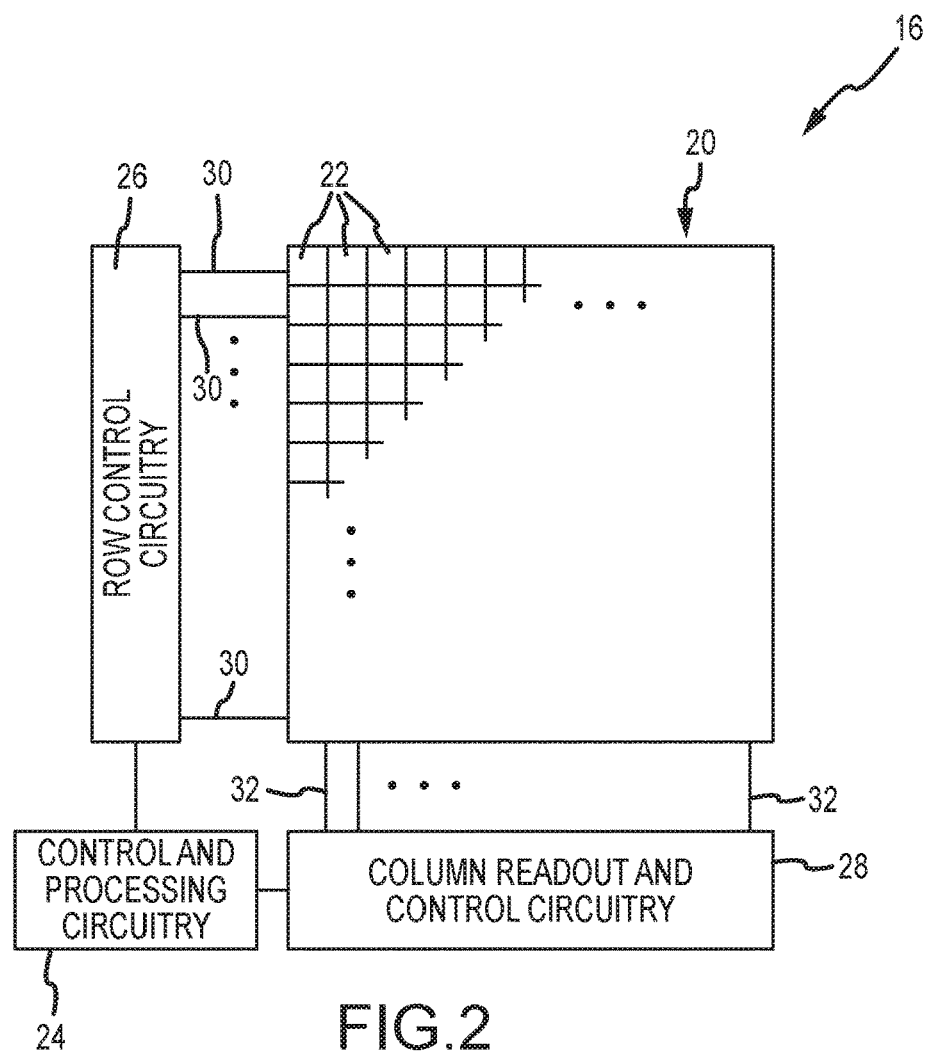
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

If desired, the color filter elements used to cover pixels 22 may be formed from fluids. The fluidic color filter elements may be controllable such that fluids of different colors can be used to cover each pixel. For example, a pixel may be covered by a red color filter fluid in a first operating mode and may be covered by a blue color filter fluid in a second operating mode.

Figure 3:
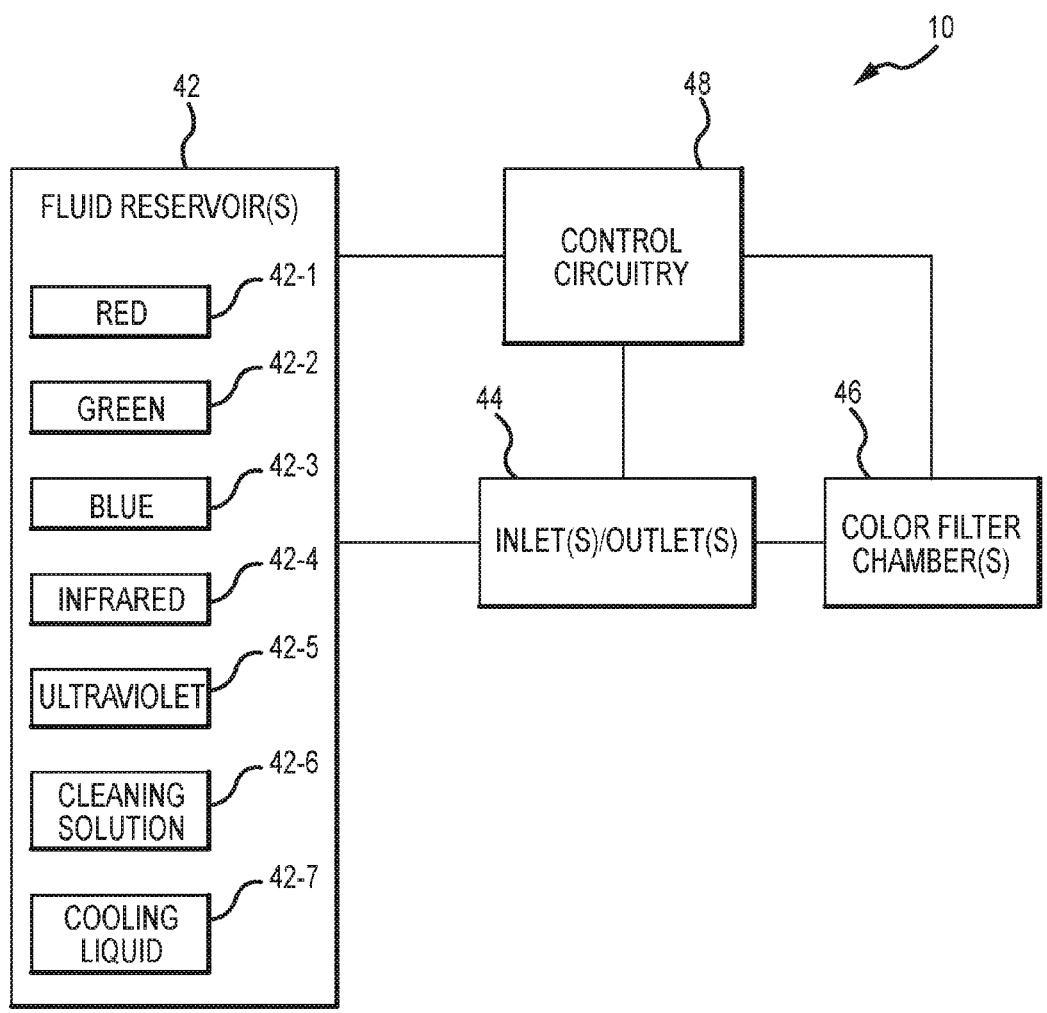
FIG. 3 is a schematic diagram of an illustrative fluidic color filter system for an electronic device in accordance with an embodiment.

A schematic diagram of an imaging system with fluidic color filter elements is shown in FIG. 3. As shown in FIG. 3, the imaging system may include one or more fluid reservoirs 42. FIG. 3 provides a number of examples of fluids that may be included in imaging system 10. As shown, red color filter fluid reservoir 42-1, green color filter fluid reservoir 42-2, blue color filter fluid reservoir 42-3, infrared color filter fluid reservoir 42-4, ultraviolet color filter fluid reservoir 42-5, cleaning solution reservoir 42-6, and cooling liquid reservoir 42-7 may be included in fluid reservoirs 42. These examples of fluid reservoirs are merely illustrative, and any desired fluid reservoirs may be included.

As shown in FIG. 3, the fluid reservoirs may be coupled to inlets/outlets 44. The inlets/outlets may couple fluid from the fluid reservoirs to color filter chambers 46. The color filter chambers may be chambers above the pixels. The color filter chambers may be formed above photodiodes of pixels 22. The color filter chambers may be interposed between photodiodes and microlenses for the pixels. Each color filter chamber may cover any desired subset of pixels in the image sensor. For example, one color filter chamber may cover only one pixel in the sensor, may cover all of the pixels in the sensor, may cover 25% of the pixels in the sensor, may cover 50% of the pixels in the sensor, may cover 33% of the pixels in the sensor, may cover 10%-50% of the pixels in the sensor, may cover 10%-30% of the pixels in the sensor, may cover less than 15% of the pixels in the sensor, may cover greater than 10% of the pixels in the sensor, may cover 40%-60% of the pixels in the sensor, or may cover some other desired subset of the pixels in the sensor. In terms of the amount of pixels covered by the color filter chamber, each color filter chamber may cover only one pixel, more than one pixel, more than ten pixels, more than one hundred pixels, more than one thousand pixels, less than one thousand pixels, less than one hundred pixels, or any other desired number of pixels.

There may be any desired number of separate color filter chambers in the imaging system. One color filter arrangement that may be used in the imaging system is a Bayer color filter pattern of red, green, and blue pixels. One color filter chamber may be associated with the red pixels in the Bayer color filter pattern, one color filter chamber may be associated with the green pixels in the Bayer color filter pattern, and one color filter chamber may be associated with the blue pixels in the Bayer color filter pattern. It may be desirable to change the color filter pattern. For example, a broadband color filter may be substituted for the green color filters in the Bayer color filter pattern. In this example, the chamber associated with the green pixels may be emptied of color filter fluid, and the chamber may be filled with broadband color filter fluid.

Each chamber may be coupled to a respective inlet/outlet. The inlet/outlet may allow color filter fluid to enter and exit the chamber and may sometimes be referred to as simply an inlet. Each inlet may be capable of receiving fluid from any reservoir in fluid reservoirs 42. For example, control circuitry 48 may be able to direct fluid from a specific fluid reservoir to a particular inlet.

In one illustrative example, a color filter chamber may cover approximately 25% of the pixels in the image sensor. The color filter chamber may be coupled to an inlet. In a color image sensing mode, the control circuitry may direct red color filter fluid from red color filter fluid reservoir 42-1 to the inlet to fill the color filter chamber. The sensor may later change to an infrared image sensing mode. The red color filter fluid may be drained from the color filter chamber and returned to red color filter reservoir 42-1. Once the color filter chamber is drained, infrared color filter fluid from infrared color filter fluid reservoir 42-4 may be sent to the color filter chamber through the inlet. In yet another embodiment, the sensor may later change to a monochrome imaging mode. The infrared color filter fluid may be replaced with monochrome color filter fluid used to obtain black and white images. The sensor may adapt to low light conditions by switching to a clear filter to absorb as much light as possible.

Any desired equipment may be included in the imaging system to move color filter fluid amongst the system in a controlled way. For example, one or more pumps may be included in the system. The control circuitry may couple a desired reservoir to a desired color filter chamber using one of the inlets. The control circuitry may then direct a pump in the reservoir to pump the color filter liquid into the color filter chamber. This example is merely illustrative, and other ways of moving fluid may be used if desired. Electrowetting, optoelectrowetting, and surface acoustic waves may all be used to control the fluid flow. If desired, different color filter fluids may be deliberately mixed to form an additional color filter fluid.

The examples of possible fluid reservoirs in fluid reservoirs 42 shown in FIG. 3 are merely illustrative. In general, the imaging system may include fluid of any desired type to fill color filter chambers. The fluid may be formed from any desired materials (i.e., organic compounds, dyes, pigments, etc.). Each reservoir may have a fluid with desired color filter properties. For example, a color filter fluid in a reservoir may be configured to filter light of a particular visible wavelength (i.e., red color filter fluid reservoir 42-1, green color filter fluid reservoir 42-2, blue color filter fluid reservoir 42-3, etc.). If desired, the color filter fluid may act as a broadband color filter (i.e., passing yellow or white light).

The color filter fluids are not limited to only filtering visible light. If desired, an infrared color filter fluid (i.e., infrared color filter fluid reservoir 42-4) may be included. The infrared color filter fluid may be used in an infrared mode. In some embodiments, the infrared color filter fluid may be used to cover all of the pixels in the sensor. In other embodiments, the infrared color filter fluid may be used to cover some of the pixels in the sensor, and visible light filter fluids may be used to cover other pixels in the sensor. In yet another embodiment, fluid reservoirs 42 may include more than one type of infrared color filter fluid. For example, a first color filter fluid may be configured to pass near-infrared light while a second color filter fluid may be configured to pass long-wavelength infrared light. Alternatively, a first color filter fluid may be configured to pass near-infrared light of a first wavelength (i.e., 940 nm) while a second color filter fluid may be configured to pass near-infrared light of a second wavelength (i.e., 1085 nm).

Instead of filtering visible or infrared light, the color filter fluid may filter ultraviolet light (e.g., ultraviolet color filter fluid 42-5) or other types of light. In general, any number of fluid reservoirs may be included to pass any desired type of light. Each color filter fluid may pass light of any desired wavelength. The color filter fluids may be used in any combination.

Additionally, instead of the color filter fluids filtering according to the wavelength of incoming light, the refractive index of the color filter fluids may be used for additional functionality. For example, a particular fluid's refractive index could be used to switch a pixel on or off based on changing between transmission and total internal reflection. Similarly, the color filter fluid may alter the polarization of incoming light.

One benefit of using fluidic color filters in an imaging system is that the color filter fluid may offer cooling benefits. In some situations, it may be desirable to reduce the heat of the imaging system and the imaging sensor. Recirculation of the color filter fluids may offer cooling benefits for the imaging system. These benefits may sometimes be obtained passively. For example, if the color filter liquid is changed from a first liquid to a second liquid, there will likely be some cooling benefits (even if the change was made for other reasons). In some cases, the system may actively take advantage of the cooling properties of the fluidic color filter system. For example, even if the optical properties of the color filters do not need to change, the color filter fluid may be recirculated to help cool the sensor. The color filter fluids may be returned from the color filter chambers to their respective fluid reservoirs then sent back to the color filter chambers to help cool the imaging sensor. In some cases, a fluid may be included specifically for its cooling properties (i.e., cooling liquid 42-7). If cooling the system is desired, the chambers may be evacuated of color filter fluid and filled with the cooling liquid. When the cooling is complete, the cooling liquid may be returned to its reservoir and the color filter chambers may be refilled with color filter fluid. The cooling liquid may be formed from any desired materials (i.e., water, ethylene glycol, propylene glycol, etc.).

One possible obstacle to the performance of the fluidic color filter system is the cross-contamination of the color filter fluids. For example, take a scenario where a color filter chamber is filled with red color filter fluid. It is then desired to switch the red color filter fluid to green color filter fluid. Accordingly, the red color filter fluid is removed from the chamber. Ideally, all of the red color filter fluid would be evacuated from the chamber when desired. However, it is possible that some red color filter fluid residue will remain in the chamber after evacuation. If this occurs, the green color filter fluid will fill the chamber and mix with the red color filter fluid residue. Depending on the amount of residue, the performance of the green color filter fluid may be degraded. In one switch of the color filter fluids, the contamination may be negligible to performance of the color filter fluids. However, the color filter fluids may be switched regularly, causing the contamination to increase steadily over time. Clearly, it is desirable to eliminate any contamination between color filter fluids if possible.

To help reduce cross-contamination between different color filter fluids, a dedicated cleaning solution may be included in a fluid reservoir. As shown in FIG. 3, cleaning solution reservoir 42-6 may be included in fluid reservoirs 42. The cleaning solution may be used to flush the color filter chambers when a switch in color filter fluids occurs. Referring again to the above example, a red color filter fluid may be changed to a green color fluid. After the red color filter fluid is removed from the color filter chamber, cleaning solution 42-6 may temporary fill the chamber and then return to its reservoir. After the cleaning solution has flushed the color filter chamber, the green color filter fluid may fill the color filter chamber. The cleaning solution may therefore help reduce any contamination between the red and green color filter fluids (because any red color filter fluid residue would be mixed with cleaning solution 42-6 instead of green color filter fluid 42-2). Cleaning solution 42-6 may be used to fill any desired color filter chamber at any desired time. Cleaning solution 42-6 may include any desired material (e.g., acetone, isopropyl alcohol).

As discussed above, steps may be taken to reduce cross-contamination between color filter fluids. However, it is still possible that the quality of the color filter fluids will decrease over time due to cross-contamination, weathering damage due to radiation such as ultraviolet (UV) radiation, or other factors. Accordingly, fluid reservoirs 42 may be replaceable. Each fluid reservoir may be individually replaceable or the entire bank of fluid reservoirs may be replaceable. The imaging system may present an indication to the user that one or more color filter fluids need to be replaced, and the user may replace the color filter fluid reservoirs accordingly.

Figure 4:
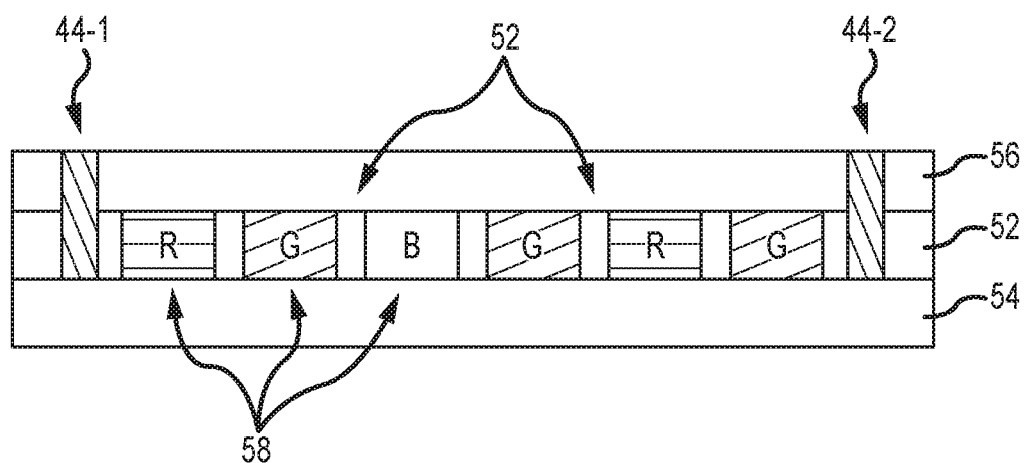
FIG. 4 is a cross-sectional side view of illustrative fluidic color filter elements of an image sensor in accordance with an embodiment.

FIG. 4 is a cross-sectional side view of an illustrative imaging sensor with a fluidic color filter system. As shown, fluidic color filter elements 58 may be included between layers 54 and 56. Blue color filter elements are labelled with a "B", red color filter elements are labelled with an "R", and green color filter elements are labeled with a "G." Layer 54 (sometimes referred to as substrate 54) may include one or more photodiodes per fluidic color filter element. In some cases, there may be one color filter element per each photodiode in substrate 54. In other cases, each color filter element may cover more than one photodiode in substrate 54 (i.e., two photodiodes, three photodiodes, four photodiodes, more than four photodiodes, more than ten photodiodes, etc.). Layer 56 may be formed over color filter elements 58. Layer 56 may be a glass layer or a layer formed from another desired material. There may be openings in layer 56 to form inlets 44-1 and 44-2.

Fluidic color filter elements 52 may be separated by walls 52. The walls may sometimes be referred to as chamber walls or channel walls. The walls may be formed from any desired material (e.g., silicon dioxide). Ideally, the walls will have good wetting properties, allowing the color filter fluid to easily be dispersed throughout the respective chambers. The walls may define color filter chambers 46.

Figure 5:
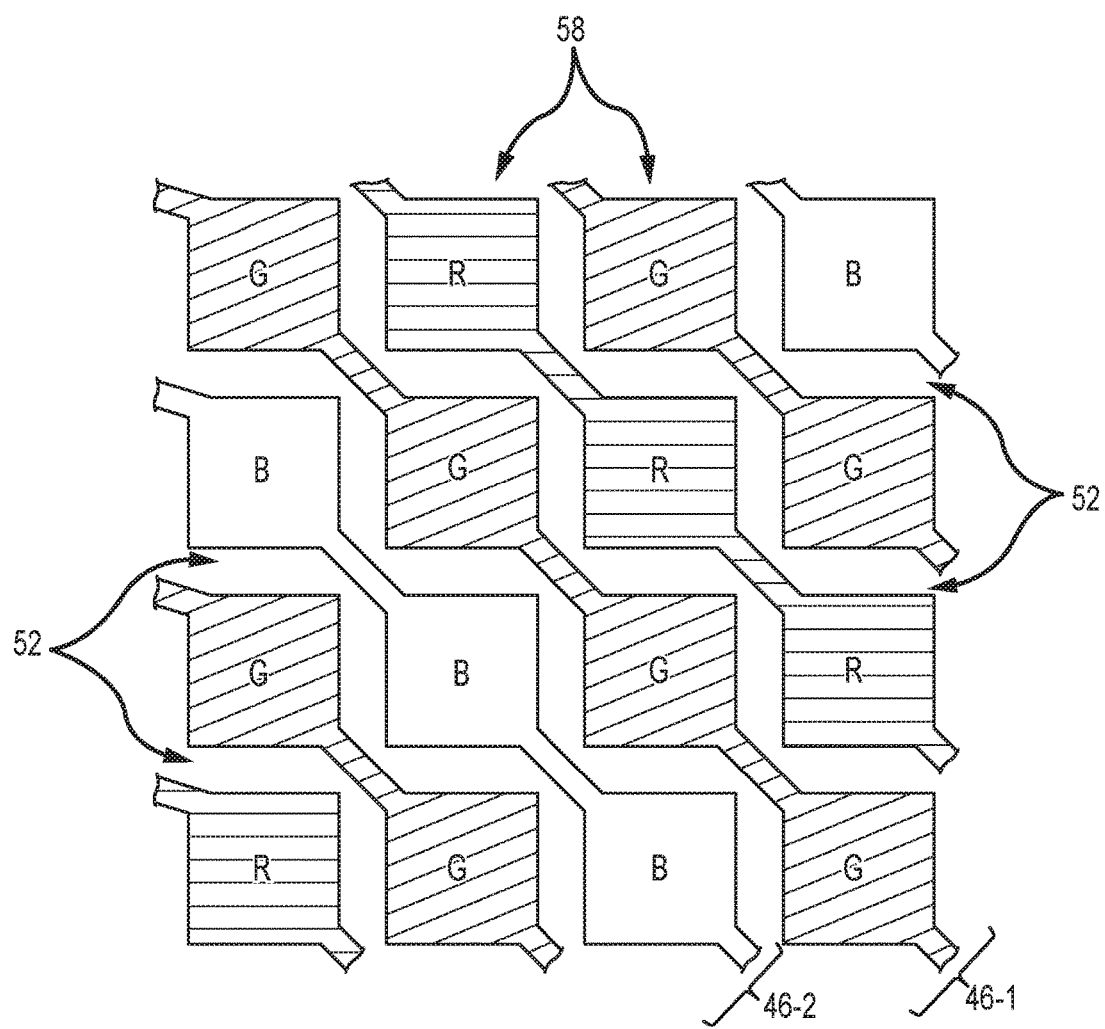
FIG. 5 is a top view of illustrative color filter chambers filled with color filter fluids in accordance with an embodiment.

FIG. 5 is a top view of illustrative fluidic color filter elements. As shown in FIG. 5, color filter elements 58 may be arranged in chambers such as chamber 46-1 and chamber 46-2 that are defined by chamber walls 52. In the illustrative embodiment of FIG. 5, the color filter elements are arranged in a Bayer color filter pattern, with two green color filter elements, one red color filter element, and one blue color filter element in a repeating unit. As shown, color filter chamber 46-1 may contain green color filter fluid while color filter chamber 46-2 may contain blue color filter fluid. Each color filter chamber may include any desired number of color filter elements. For example, all of the green color filter elements may be in a continuous chamber 46-1. Alternatively, some of the green color filter elements may be formed in a different chamber than other green color filter elements.

Figure 6:
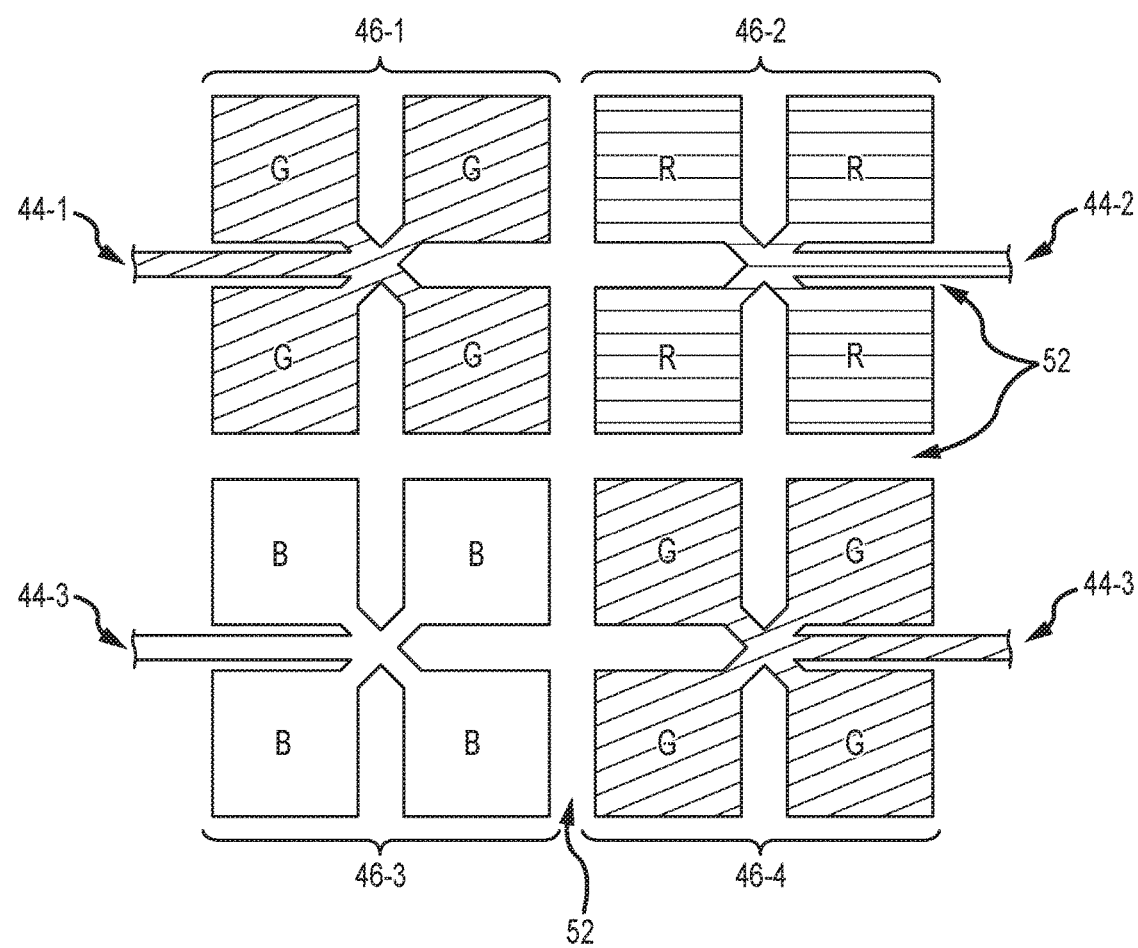
FIGS. 6 and 7 are top views of illustrative color filter chambers that include color filter elements arranged in groups in accordance with an embodiment.
Figure 7:
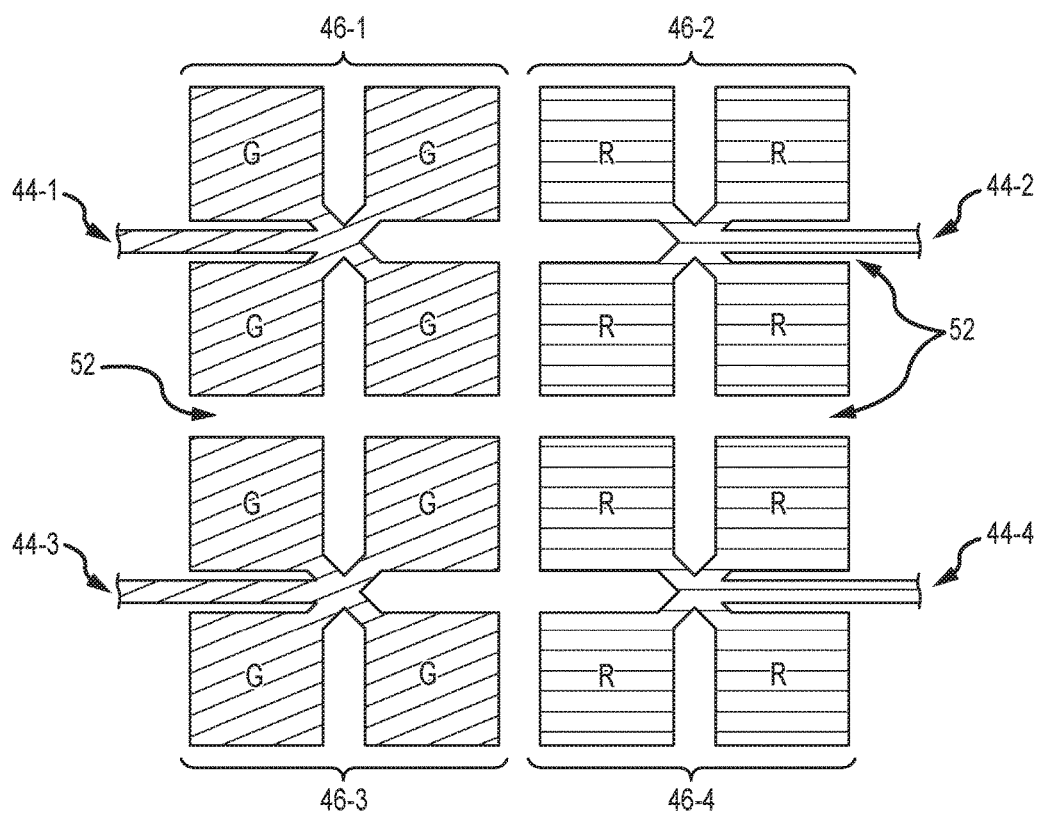

If desired, larger groups of pixels with the same color may be created. An example of this type is shown in FIG. 6. As shown, an inlet 44-1 may supply green color filter fluid to chamber 46-1. Inlet 44-2 may supply red color filter fluid to chamber 46-2. Inlet 44-3 may supply blue color filter fluid to chamber 46-3. Inlet 44-4 may supply green color filter fluid to chamber 46-4. Each chamber may include four fluidic color filter elements arranged in a 2×2 square. The 2×2 squares may be arranged in a Bayer color filter pattern, as shown in FIG. 6. In some cases, it may be desirable for the image sensor to use the color filter pattern shown in FIG. 6 (with green fluid in chamber 46-1, red fluid in chamber 46-2, blue fluid in chamber 46-3, and green fluid in chamber 44-4). However, at other times it may be desirable to change the colors of the color filter elements. FIG. 7 shows a top view of the color filters of FIG. 6 with the color filter fluids changed into a different pattern.

As shown in FIG. 7, an inlet 44-1 may supply green color filter fluid to chamber 46-1. Inlet 44-2 may supply red color filter fluid to chamber 46-2. Inlet 44-3 may supply green color filter fluid to chamber 46-3. Inlet 44-4 may supply red color filter fluid to chamber 46-4. This pattern of color filter elements uses the same chamber structure as the pattern shown in FIG. 6. However, in FIG. 7 the color filter fluid used to fill the particular chambers has changed. Each chamber may be filled with any desired color filter fluid.

In some embodiments, multiple layers of fluidic color filter elements may be included in the imaging system. The layers may overlap such that each pixel (or group of pixels) is covered by two color filter elements. For example, one of the layers of fluidic color filter elements may include visible light color filter fluid, and another layer of fluidic color filter elements may include infrared light color filter fluid.

In some embodiments, an image sensor may include both solid color filters and fluidic color filters. For example, an image sensor may include a layer of solid color filter elements that covers the entire pixel array formed adjacent to a layer of fluidic color filter elements that cover the entire pixel array. Alternatively, a single layer of color filter elements may include some solid color filter elements and some fluidic color filter elements. The solid color filter elements may cover a first portion of the pixel array and the fluidic color filter elements may cover a second portion of the pixel array.

Figure 8:
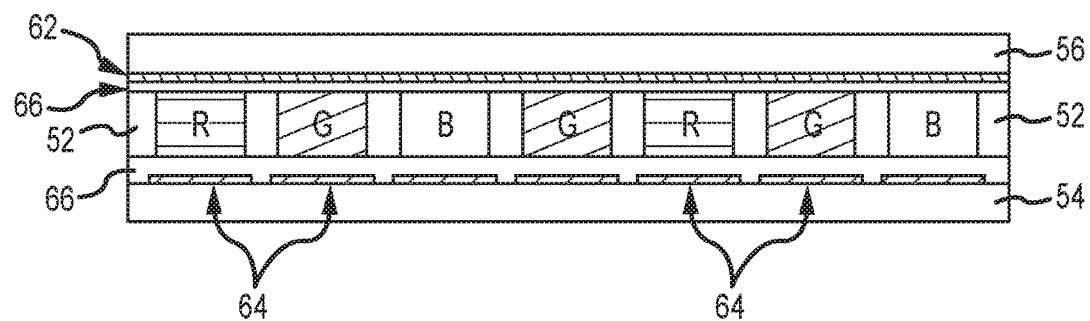
FIG. 8 is a cross-sectional side view of illustrative fluidic color filter elements that are controlled using electrowetting in accordance with an embodiment.

As previously discussed, any desired equipment may be included for moving the color filter fluid between desired areas. FIG. 8 is a cross-sectional side view of an illustrative fluidic color filter system that uses electrowetting to move color filter fluid. As shown, color filter elements 58 may be positioned between substrate 54 and glass layer 56 (similar to as shown in FIG. 4). However, color filter elements 58 may also be positioned between electrode 62 and electrodes 64. Electrode 62 may be coupled to ground or some other reference voltage. Electrode 62 may be blanketed across the entire array. In contrast, electrodes 64 may be positioned adjacent to one color filter element. Electrodes 64 may be formed from patterned conductive material and therefore may sometimes be referred to as patterned electrodes. Each electrode may be independently controllable. Voltage may be selectively applied to electrodes 64 to provide an electric field that attracts or repels the color filter element fluids. Applying voltage to the electrodes may locally modify the hydrophobicity (or hydrophilicity) of the chamber. In some cases, the electrodes may make the chamber more hydrophilic (or less hydrophobic), thereby attracting the color filter fluid. Accordingly, if a color filter chamber was being filled, the voltage may be applied to the electrodes of the color filter chamber. Alternatively, the electrodes may make the chamber more hydrophobic (or less hydrophilic). Accordingly, if a color filter chamber was being filled, the voltage may be applied to the electrodes of neighboring color filter chambers to drive the fluid towards the chamber of interest.

The above examples describe the electrodes making the chambers "hydrophobic" and "hydrophilic." This does not mean to imply that the color filter fluids have to be water based. The color filter fluids may be formed from any desired material, and the electrodes may attract or repel the color filter fluids.

Because the electrodes are formed over the photodiodes of the imaging sensor, it may be desirable for electrodes 62 and 64 to be substantially transparent (i.e., allow greater than 90%, greater than 95%, or greater than 99% of incoming light to pass). Accordingly, the electrodes may be formed from a transparent material such as tin doped indium oxide (indium tin oxide or ITO), fluorine doped tin oxide, aluminum doped zinc oxide, or any other desired transparent conductive material. The electrodes may be separated from directly contacting color filter elements 58 and walls 52 by insulation layers 66. An insulation layer 66 may be formed between electrode 62 and color filter elements 58, and an insulation layer 66 may be formed between electrodes 64 and color filter elements 58. The insulating layers may be formed from any desired material (i.e., silicon dioxide, silicon nitride, etc.).

FIG. 8 depicts the ground electrode as being formed above the color filter elements between the color filter elements and layer 56 and the electrodes 64 as being formed below the color filter elements between the color filter elements and substrate 54. However, this example is merely illustrative and the electrodes may be positioned at any desired location within the sensor. For example, one or more electrodes may be positioned on or in walls 52. If desired, electrodes 64 may be formed above color filter elements 58 and ground electrode 62 may be formed below color filter elements 58.

The precise control of flow of the color filter fluids enabled by electrowetting may enable additional functionality in the fluidic color filter system. For example, a bubble may be inserted between liquid drops to modify the refractive index of the color filter fluid. Additionally, the electrowetting electrodes may be used in combination with other techniques of moving fluids (e.g., a pump).

In various embodiments, an imaging system may include a plurality of photodiodes, color filter chambers positioned above the plurality of photodiodes that are defined by walls that are interposed between first and second layers, a plurality of fluid reservoirs that each contain a respective fluid, a ground electrode interposed between the color filter chambers and the first layer, and a plurality of electrodes interposed between the color filter chambers and the second layer. Voltages may be applied to the plurality of electrodes to control flow of fluid from the fluid reservoirs through the color filter chambers.

The plurality of fluid reservoirs may include a red color filter element fluid reservoir, a blue color filter element fluid reservoir, and a green color filter element fluid reservoir. The plurality of fluid reservoirs may include an infrared color filter element fluid reservoir. The plurality of fluid reservoirs may include an ultraviolet color filter element fluid reservoir. The plurality of fluid reservoirs may include a cleaning solution fluid reservoir. The plurality of fluid reservoirs may include a cooling liquid fluid reservoir. Each color filter chamber may have a respective inlet.

The ground electrode and the plurality of electrodes may be formed from transparent material. The ground electrode and the plurality of electrodes may be formed from indium tin oxide. The first layer may include a glass layer. The glass layer may have openings that allow the fluid from the fluid reservoirs to be supplied to the color filter chambers. The walls that define the color filter chambers may include silicon dioxide. The imaging system may also include a first insulating layer interposed between the color filter chambers and the ground electrode and a second insulating layer interposed between the color filter chambers and the plurality of electrodes. The plurality of electrodes may include a first electrode and a voltage may be applied to the first electrode to attract a fluid from the plurality of fluid reservoirs to a position in the color filter chamber above the first electrode. The imaging system may include one or more additional layers of color filter chambers formed above the color filter chambers.

In various embodiments, an imaging sensor may include a substrate, a plurality of photodiodes in the substrate, a glass layer positioned above the substrate, walls that are interposed between the substrate and the glass layer and that define color filter chambers, a ground electrode that covers all of the photodiodes in the imaging sensor and that is interposed between the walls and the glass layer, and a plurality of independently addressable patterned electrodes that are interposed between the walls and the substrate. Voltages may be applied to the plurality of independently addressable patterned electrodes to position color filter fluid within the color filter chambers. The color filter fluid may form color filter elements for the image sensor and each color filter element may cover only one photodiode. The color filter fluid may form color filter elements for the image sensor and each color filter element may cover more than one photodiode.

In various embodiments, a method of operating an imaging system that includes photodiodes, electrodes and at least one color filter chamber includes applying voltages to the electrodes to move a first type of color filter fluid from a first fluid reservoir to the color filter chamber, obtaining image signals based on incident light that passes through the first type of color filter fluid using the photodiodes, applying voltages to the electrodes to move the first type of color filter fluid from the color filter chamber to the first fluid reservoir, applying voltages to the electrodes to move a second type of color filter fluid from a second fluid reservoir to the color filter chamber, and obtaining image signals based on incident light that passes through the second type of color filter fluid using the photodiodes.

The foregoing is merely illustrative of the principles of this invention and various modifications can be made by those skilled in the art. The foregoing embodiments may be implemented individually or in any combination.

What is claimed is:

1. An imaging sensor comprising:
 a substrate;
 a plurality of photodiodes in the substrate;
 a glass layer positioned above the substrate;
 walls that are interposed between the substrate and the glass layer, wherein the walls define color filter chambers;
 a ground electrode that covers all of the photodiodes in the imaging sensor, wherein the ground electrode is interposed between the walls and the glass layer;
 a first insulating layer interposed between the walls and the ground electrode;
 a plurality of independently addressable patterned electrodes that are interposed between the walls and the substrate, wherein voltages are applied to the plurality of independently addressable patterned electrodes to position color filter fluid within the color filter chambers; and
 a second insulating layer interposed between the walls and the plurality of independently addressable patterned electrodes.

2. The imaging sensor defined in claim 1, wherein the color filter fluid forms color filter elements for the image sensor and wherein each color filter element covers only one photodiode.

3. The imaging sensor defined in claim 1, wherein the color filter fluid forms color filter elements for the image sensor and wherein each color filter element covers more than one photodiode.

4. The imaging sensor defined in claim 1, wherein the first insulating layer is in direct contact with the walls and the ground electrode and wherein the second insulating layer is in direct contact with the walls and the plurality of independently addressable patterned electrodes.

5. The imaging sensor defined in claim 1, further comprising one or more additional layers of color filter chambers formed above the color filter chambers.

6. The imaging sensor defined in claim 1, wherein the walls comprise silicon dioxide.

7. The imaging sensor defined in claim 1, wherein the glass layer has openings that allow the color filter fluid to be supplied to the color filter chambers from fluid reservoirs.

8. The imaging sensor defined in claim 1, wherein each color filter chamber has a respective inlet.

9. The imaging sensor defined in claim 1, wherein the ground electrode and the plurality of independently addressable patterned electrodes are formed from transparent material.

10. The imaging sensor defined in claim 1, wherein the ground electrode and the plurality of independently addressable patterned electrodes are formed from indium tin oxide.

11. The imaging sensor defined in claim 1, further comprising:
 a plurality of fluid reservoirs, wherein each fluid reservoir contains a respective color filter fluid.

12. The imaging sensor defined in claim 11, wherein the plurality of fluid reservoirs comprises an infrared color filter element fluid reservoir that contains infrared color filter fluid.

13. The imaging sensor defined in claim 11, wherein the plurality of fluid reservoirs comprises a red color filter element fluid reservoir that contains red color filter fluid, a blue color filter element fluid reservoir that contains blue color filter fluid, and a green color filter element fluid reservoir that contains green color filter fluid.

14. The imaging sensor defined in claim 11, wherein the plurality of fluid reservoirs comprises an ultraviolet color filter element fluid reservoir that contains ultraviolet color filter fluid.

15. The imaging sensor defined in claim 11, wherein the plurality of fluid reservoirs comprises a cleaning solution fluid reservoir that contains cleaning solution.

16. The imaging sensor defined in claim 11, wherein the plurality of fluid reservoirs comprises a cooling liquid fluid reservoir that contains cooling fluid.

\* \* \* \* \*